US009238579B2

(12) United States Patent
Ochs et al.

(10) Patent No.: US 9,238,579 B2
(45) Date of Patent: Jan. 19, 2016

(54) CAVITY PACKAGE DESIGN

(71) Applicant: Robert Bosch GmbH, Stuttgart (DE)

(72) Inventors: Eric Ochs, Pittsburgh, PA (US); Jay S. Salmon, Pittsburgh, PA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/827,112

(22) Filed: Mar. 14, 2013

(65) Prior Publication Data

US 2013/0256815 A1 Oct. 3, 2013

Related U.S. Application Data

(60) Provisional application No. 61/617,159, filed on Mar. 29, 2012.

(51) Int. Cl.
*H01L 29/84* (2006.01)
*B81B 7/00* (2006.01)
*B81C 1/00* (2006.01)

(52) U.S. Cl.
CPC ............ *B81B 7/0077* (2013.01); *B81C 1/0065* (2013.01); *B81C 1/00309* (2013.01)

(58) Field of Classification Search
CPC  B81C 1/007; B81C 1/00269; B81C 1/00301; B81C 1/00309; B81B 7/0032; B81B 7/0035; H04R 1/04
USPC .................................. 257/254, 416, E29.324
See application file for complete search history.

(56) References Cited

U.S. PATENT DOCUMENTS

| 7,166,910 | B2 | 1/2007 | Minervini |
| 7,868,402 | B2 | 1/2011 | Huang et al. |
| 8,030,722 | B1 | 10/2011 | Bolognia et al. |
| 8,121,331 | B2 | 2/2012 | Minervini |
| 2008/0175425 | A1 | 7/2008 | Roberts et al. |
| 2010/0142325 | A1 | 6/2010 | Altman et al. |
| 2010/0322443 | A1 | 12/2010 | Wu et al. |

(Continued)

FOREIGN PATENT DOCUMENTS

| CN | 201138866 | 10/2008 |
| CN | 101316461 | 12/2008 |

(Continued)

OTHER PUBLICATIONS

Leinenbach, C. et al., "A new capacitive Type Mems Microphone," Micro Electro Mechanical Systems (MEMS), 2010 IEEE 23rd International Conference, pp. 659-662.

(Continued)

*Primary Examiner* — Whitney T Moore
*Assistant Examiner* — Scott Stowe
(74) *Attorney, Agent, or Firm* — Michael Best & Friedrich LLP

(57) ABSTRACT

A semiconductor device. The device including a substrate having electrical traces, at least one of a MEMS die and a semiconductor chip mounted on the substrate, and a spacer. The spacer has a first end connected to the substrate and includes electrical interconnects coupled to the electrical traces. The at least one MEMS die and a semiconductor chip are contained within the spacer. The spacer and substrate form a cavity which contains the at least one MEMS die and a semiconductor chip. The cavity forms an acoustic volume when the semiconductor device is mounted to a circuit board via a second end of the spacer.

14 Claims, 4 Drawing Sheets

(56) References Cited

U.S. PATENT DOCUMENTS

2010/0322451 A1 12/2010 Wu et al.
2011/0075875 A1 3/2011 Wu et al.

FOREIGN PATENT DOCUMENTS

| CN | 201550275 | 8/2010 |
| EP | 1722596 | 11/2006 |
| EP | 1992588 | 11/2008 |
| WO | 07123300 | 11/2007 |
| WO | 2011093584 | 8/2011 |

OTHER PUBLICATIONS

International Search Report and Written Opinion for Application No. PCT/US2013/031577 dated Sep. 10, 2013 (7 pages).

Chinese Patent Office Action for Application No. 201380018033.2 dated Aug. 5, 2015 (22 pages, including English translation).

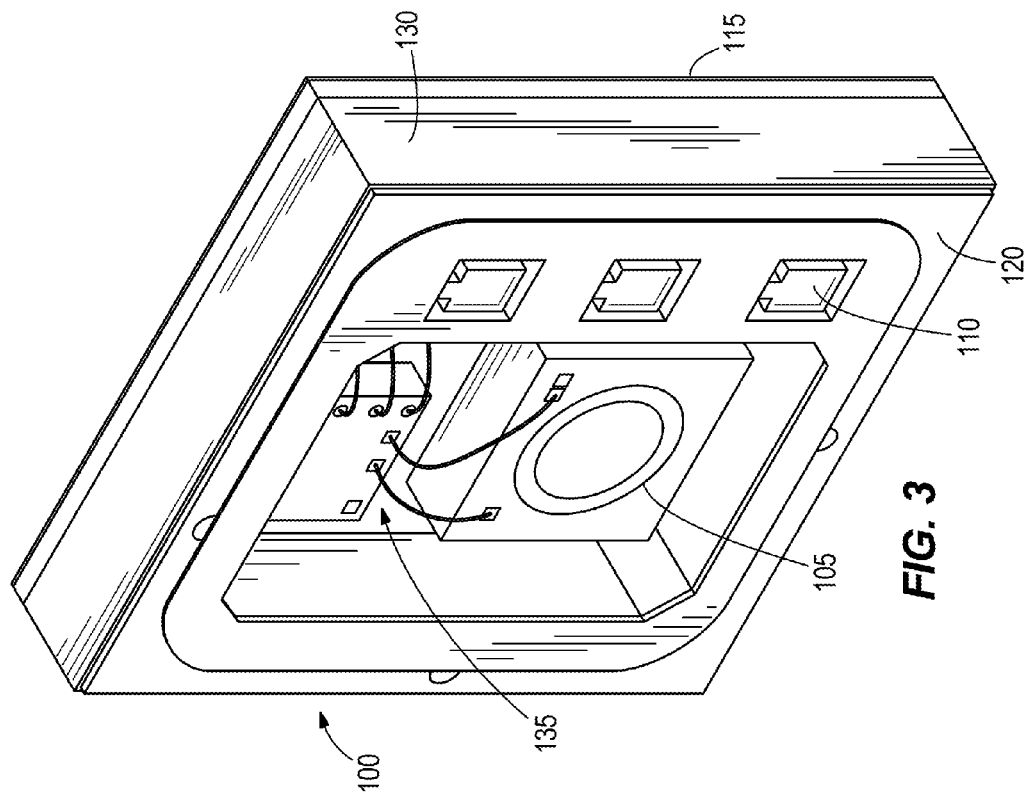
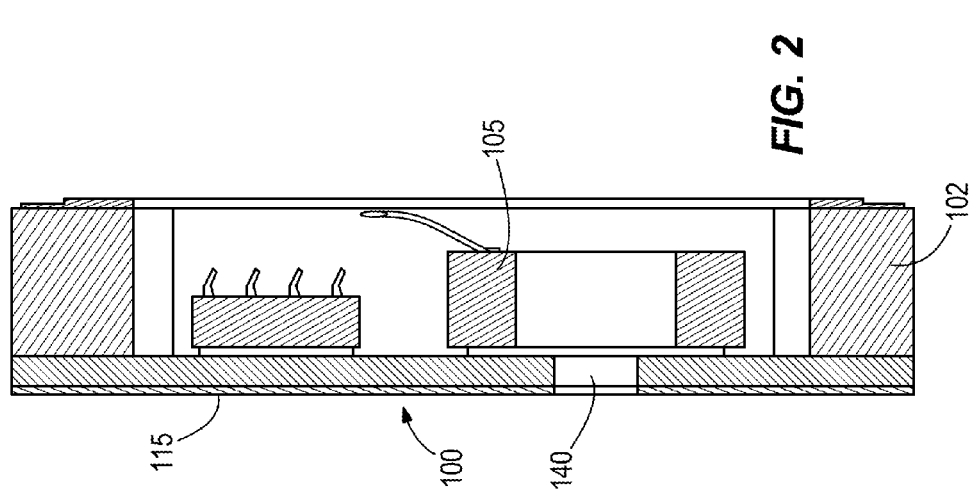
FIG. 3
FIG. 2

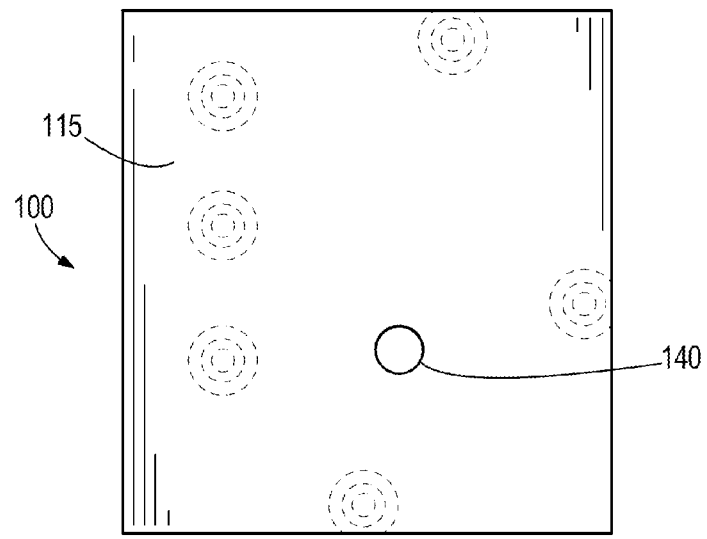
FIG. 4C
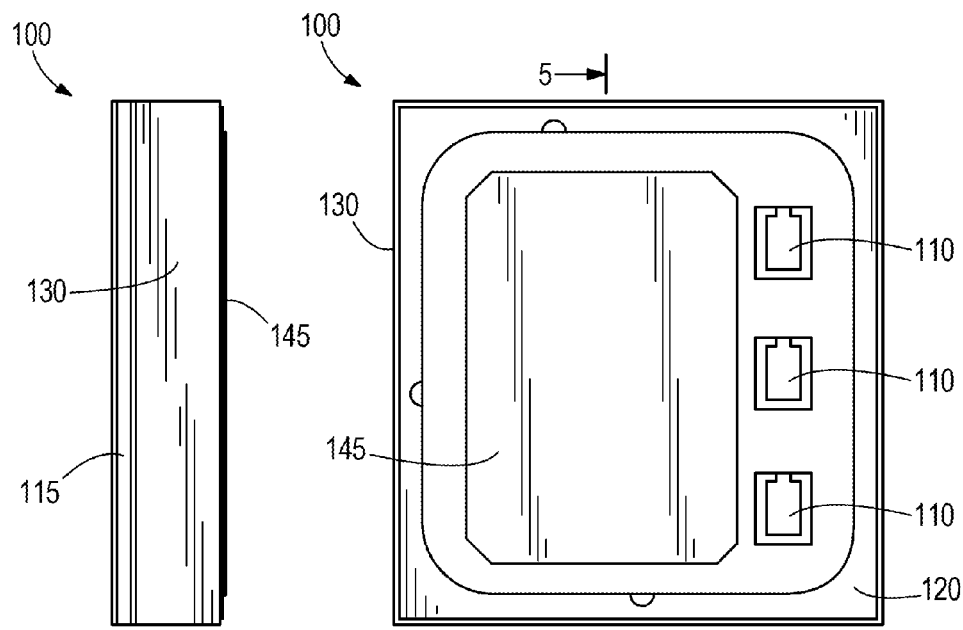
FIG. 4B  FIG. 4A

US 9,238,579 B2

CAVITY PACKAGE DESIGN

RELATED APPLICATION

The present patent application claims the benefit of prior filed co-pending U.S. Provisional Patent Application No. 61/617,519, filed on Mar. 29, 2012, the entire content of which is hereby incorporated by reference.

BACKGROUND

Embodiments of the invention relate to semiconductor packages for MEMS microphones, pressure sensor applications, and similar applications. More particularly, one embodiment of the invention relates to a method for creating an ultra-low height semiconductor device package suitable for use with a MEMS microphone.

SUMMARY

In one embodiment, the invention provides a semiconductor device. The device including a substrate having electrical traces, at least one of a MEMS die and a semiconductor chip mounted on the substrate, and a spacer. The spacer has a first end connected to the substrate and includes electrical interconnects coupled to the electrical traces. The at least one MEMS die and a semiconductor chip are contained within the spacer. The spacer and substrate form a cavity which contains the at least one MEMS die and a semiconductor chip. The cavity forms an acoustic volume when the semiconductor device is mounted to a circuit board via a second end of the spacer.

In another embodiment the invention provides method of manufacturing a semiconductor device. The method includes creating a substrate with a plurality of electrical traces, mounting at least one of a MEMS die and a semiconductor chip on a substrate, the at least one of a MEMS die and a semiconductor chip electrically coupled to the plurality of electrical traces, and mounting a first end of a spacer to the substrate, the spacer including a plurality of electrical interconnects, the plurality of electrical interconnects electrically coupled to the plurality of electrical traces. The substrate and the spacer form a cavity, and the at least one of a MEMS die and a semiconductor chip are positioned in the cavity.

Aspects of the invention will become apparent by consideration of the detailed description and accompanying drawings.

BRIEF DESCRIPTION OF THE DRAWINGS

FIG. 2 is a cut-away view of the first embodiment of the ultra-low-height semiconductor device package.

FIG. 3 is a plan view of the first embodiment of the ultra-low-height semiconductor device package.

FIG. 4a is a top view of a second embodiment of an ultra-low-height semiconductor device package.

FIG. 4b is a side view of the second embodiment of the ultra-low-height semiconductor device package.

FIG. 4c is a bottom view of the second embodiment of the ultra-low-height semiconductor device package.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1C:
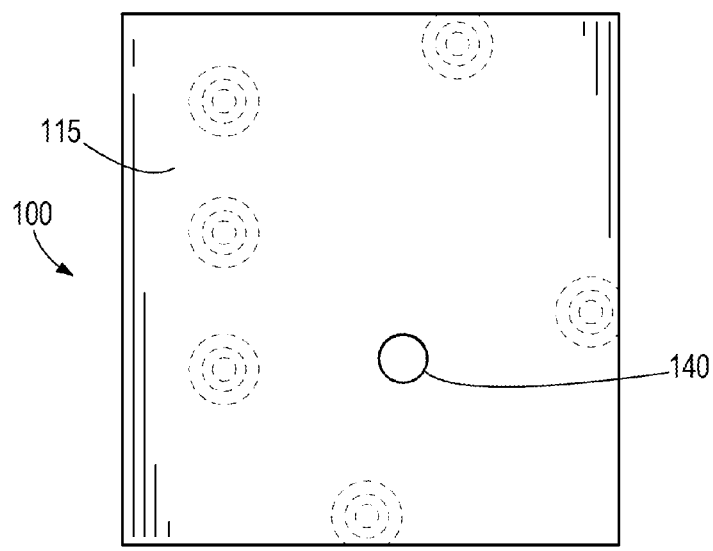
FIG. 1c is a bottom view of the first embodiment of the ultra-low-height semiconductor device package.
Figure 1B:
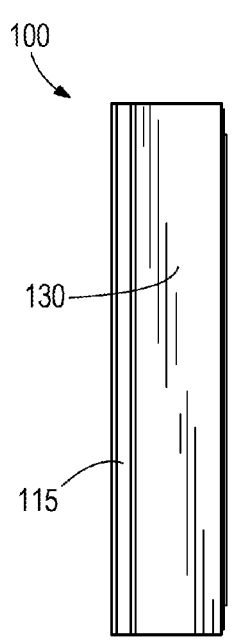
FIG. 1b is a side view of the first embodiment of the ultra-low-height semiconductor device package.
Figure 1A:
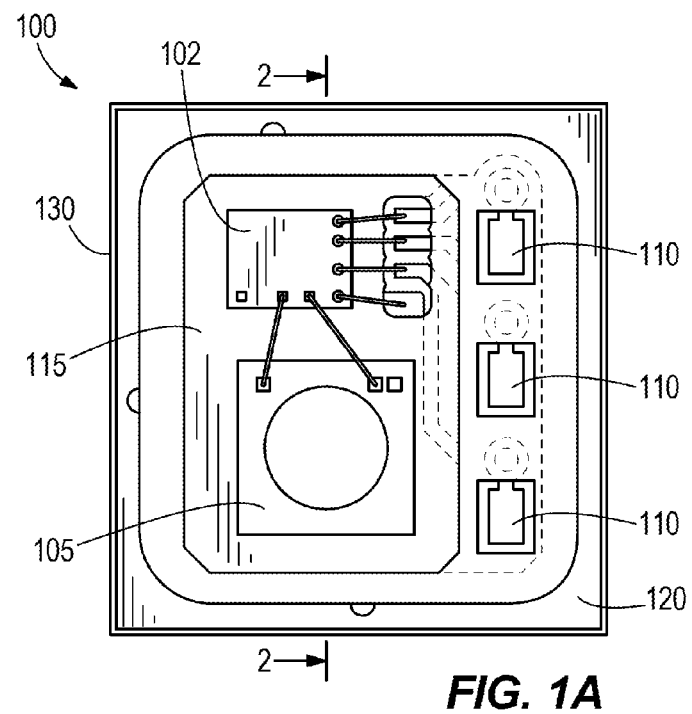
FIG. 1a is a top view of a first embodiment of an ultra-low-height semiconductor device package.

FIGS. 1a, 1b, 1c, 2, and 3 show a package design of a semiconductor device 100 having an open cavity construction that creates a pocket for one or more semiconductor chips 102 and/or MEMS die 105 and associated electrical interconnects 110 (e.g. by wire bonds or flip-chip). A top substrate 115 of the assembly serves as a mounting plane for the semiconductor chips 102 and MEMS dies 105 as well as a routing surface for electrical signals. In one embodiment the top substrate 115 is a printed circuit board (PCB). A spacer ring 120 is bonded to the top substrate 115 of the package 100 to form walls that elevate the semiconductor die 100 and, if applicable, associated wire bonds above the surface of a final PCB assembly providing clearance for wire bonds and/or circuitry on a top surface of the die. In addition to forming package walls, the spacer 120 provides a medium for routing electrical signals (i.e., the electrical interconnects 110) to the bottom of the package and a strain relief between the die and the final assembly vehicle (e.g., a customer PCB). In one embodiment, the spacer 120 is made of PCB material. A bottom surface of the spacer ring 120 has conductive surfaces that provide an electrical interconnect between the package and a final assembly.

In some embodiments, the spacer 120 is formed around the electrical interconnects 110. Electrical paths (e.g., traces) on the top substrate 115 are electrically coupled to the electrical interconnects 110 in the spacer 120. When the semiconductor device 100 is mounted to a manufacturer's circuit board, electrical connections on the manufacturer's circuit board are electrically coupled to the semiconductor chips 102 and MEMS dies 105 via the electrical interconnects 110. In other embodiments, the electrical interconnects 110 are routed on the surface of the spacer 120.

As shown in FIG. 3, the semiconductor device 100 includes a spacer/interconnect 130. A cavity 135 is formed in the device 100 by the spacer 120. In some embodiments of the semiconductor device 100, a port 140 (e.g., an acoustic port of a MEMS microphone) is formed through the top substrate 115.

The semiconductor device 100 mounts directly to a manufacturer's circuit board, and eliminates the need for a second substrate (i.e., over the cavity 135). The semiconductor device 100 forms necessary acoustic volumes for a MEMS microphone when the semiconductor device 100 is mounted to the manufacturer's circuit board, and provides a thinner package than was previously available.

In applications requiring a sealed cavity, a sealant (e.g., flip chip underfill material, die attach epoxy, etc.) may be dispensed around the perimeter of the package or under the package walls to create an air tight seal between ambient surroundings and the interior cavity of the package. Alternate embodiments of the seal may also include a patterned metal ring around the perimeter that would be compatible with solder attach processes. In this case, the ring could also be used to construct a faraday cage for shielding purposes. Such a cage would require the addition of a copper plate or patterned metal on the top surface of the package with appropriate connections between the top side copper and seal ring on the bottom of the package. In cases where exposure of the cavity to ambient pressures is required, such as pressure sensors, it is possible to partially remove the seal ring allowing air passages to form between the package and the PCB (on which the package is mounted). Larger air passages could be created through the use of cut outs in the package walls or holes in the top surface of the package.

Figure 6:
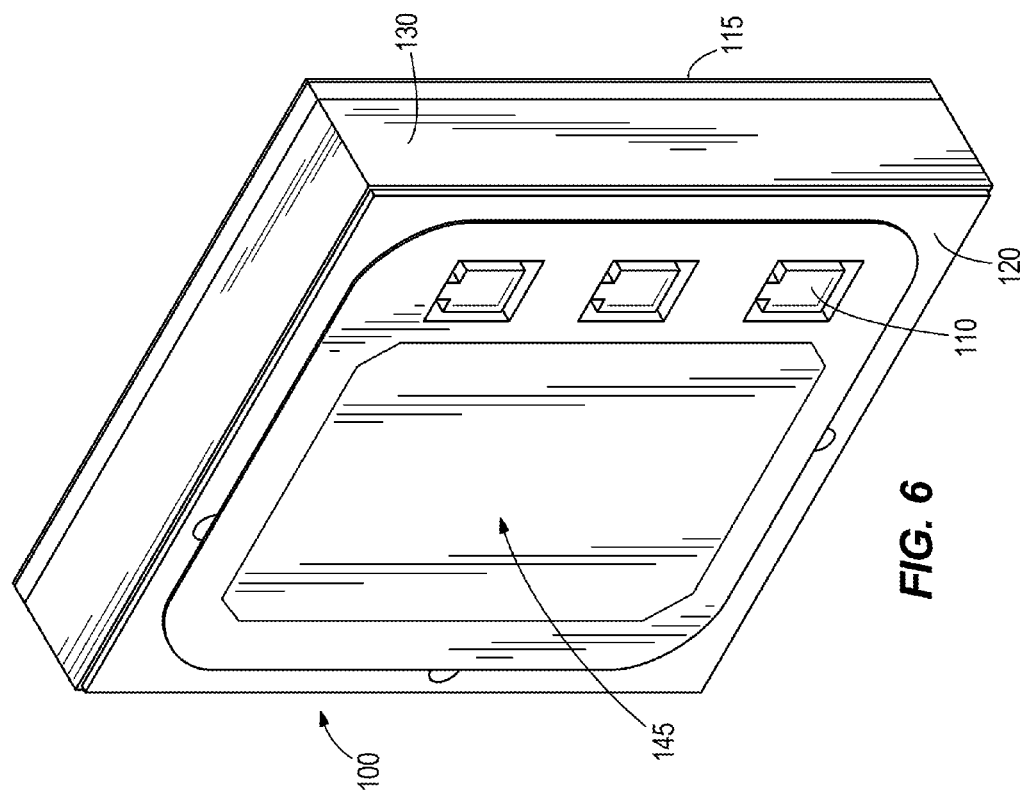
FIG. 6 is a plan view of the second embodiment of the ultra-low-height semiconductor device package.
Figure 5:
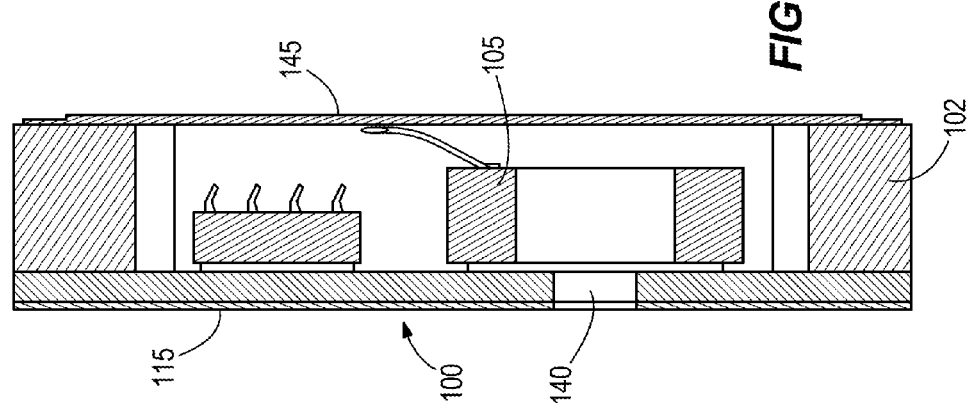
FIG. 5 is a cut-away view of the second embodiment of the ultra-low-height semiconductor device package.

An alternate embodiment of the package, shown in FIGS. 4a, 4b, 4c, 5, and 6, includes a cover 145 that is bonded over the cavity 135 to form an air tight seal. The cover 145 is formed with thin film (e.g., capton tape, polyimide) patterned with openings to expose the electrical land pads 110 embedded in the spacer ring. The embodiment improves the testability of devices that require a defined back volume or sealed cavity 135, allowing the semiconductor device 100 with a MEMS microphone to be tested without mounting on a circuit board. Still, the embodiment shown maintains the thin profile previously discussed.

Thus, the invention provides, among other things, a semiconductor device for carrying one or more chips and/or MEMS dies which has an ultra-thin profile.

What is claimed is:

1. A semiconductor device, the device comprising:
   a substrate having a first side and having electrical routing traces;
   at least one of a MEMS die and a semiconductor chip mounted on the first side of the substrate; and
   a spacer having a first end and a second end opposite the first end, the first end connected to the first side of the substrate and including electrical interconnects coupled to the electrical traces, the at least one MEMS die and a semiconductor chip contained within the spacer;
   a thin-film cover having a plurality of openings, the thin-film cover mounted on the second end of the spacer, the openings exposing the electrical interconnects;
   wherein the spacer and substrate form a cavity which contains the at least one MEMS die and a semiconductor chip, the cavity forming an acoustic volume; and
   wherein the semiconductor device is mounted to a circuit board via the second end of the spacer.

2. The semiconductor device of claim 1, wherein the electrical interconnects are embedded in the spacer.

3. The semiconductor device of claim 1, wherein the thin-film cover is made of a polymide.

4. The semiconductor device of claim 1, wherein the thin-film cover is a capton tape.

5. The semiconductor device of claim 1, wherein the substrate, the spacer, and the cover form an acoustic volume.

6. The semiconductor device of claim 1, wherein a height of the spacer is equal to a height of at least one of the MEMS die and the semiconductor chip.

7. A method of manufacturing a semiconductor device, the method comprising:
   creating a substrate with a plurality of electrical routing traces;
   mounting at least one of a MEMS die and a semiconductor chip on a first side of the substrate, the at least one of a MEMS die and a semiconductor chip electrically coupled to the plurality of electrical routing traces; and
   mounting a first end of a spacer to the first side of the substrate, the spacer including a plurality of electrical interconnects, the plurality of electrical interconnects electrically coupled to the plurality of electrical routing traces; and
   mounting a thin-film cover on a second end of the spacer opposite the first end, the thin-film cover having openings that expose the plurality of electrical interconnects;
   wherein the substrate and the spacer form a cavity, the at least one of a MEMS die and a semiconductor chip positioned in the cavity.

8. The method of claim 7, wherein the thin-film cover is made of a polymide.

9. The method of claim 7, wherein the thin-film cover is a capton tape.

10. The method of claim 7, wherein the electrical interconnects are embedded in the spacer.

11. The method of claim 7, wherein the substrate, the spacer, and the cover form an acoustic volume.

12. The method of claim 11, wherein when a MEMS microphone is mounted in the cavity, the semiconductor device is capable of being tested without mounting the semiconductor device to a circuit board.

13. The method of claim 7, wherein a height of the spacer is equal to a height of at least one of the MEMS die and the semiconductor chip.

14. The method of claim 7, wherein when the semiconductor device is mounted to a circuit board, via a second end, opposite the first end, of the spacer, the at least one of a MEMS die and a semiconductor chip are electrically coupled to the circuit board by the plurality of electrical interconnects.

* * * * *